(12) United States Patent
Lojek

(10) Patent No.: US 7,101,760 B1
(45) Date of Patent: Sep. 5, 2006

(54) CHARGE TRAPPING NANOCRYSTAL DIELECTRIC FOR NON-VOLATILE MEMORY TRANSISTOR

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/096,833

(22) Filed: Mar. 31, 2005

(51) Int. Cl.
*H01L 21/336* (2006.01)
(52) U.S. Cl. ...................... 438/260; 438/479; 438/665; 257/311; 257/E29.106; 257/E21.297; 977/779; 977/943
(58) Field of Classification Search ................ 438/503, 438/665, 260, 257, 479, 694, 695; 257/311, 257/E33.073, E29.106, E21.297; 977/779, 977/943
See application file for complete search history.

(56) References Cited

U.S. PATENT DOCUMENTS

| | | | |
|---|---|---|---|
| 6,344,403 B1 | 2/2002 | Madhukar et al. .......... 438/503 |
| 6,646,302 B1 | 11/2003 | Kan et al. .................... 257/321 |
| 6,690,059 B1 | 2/2004 | Lojek .......................... 257/316 |
| 6,743,709 B1 | 6/2004 | Kan et al. .................... 438/622 |
| 6,774,061 B1 * | 8/2004 | Coffa et al. .......... 257/E21.209 |
| 6,808,986 B1 | 10/2004 | Rao et al. .................... 438/257 |
| 2003/0042833 A1 | 3/2003 | Trujillo et al. .............. 313/309 |
| 2004/0130941 A1 | 7/2004 | Kan et al. .................... 365/177 |
| 2005/0014335 A1 * | 1/2005 | Goldbach et al. ........... 438/257 |
| 2006/0030105 A1 * | 2/2006 | Prinz et al. ................. 438/260 |

OTHER PUBLICATIONS

J. Kong et al., "Chemical Vapor Deposition of Methane for Single-Walled Carbon Nanotubes", Chemical Physics Letters, 292, Aug. 14, 1998, pp. 567-574.

* cited by examiner

*Primary Examiner*—Michelle Estrada
(74) *Attorney, Agent, or Firm*—Schneck & Schneck; Thomas Schneck

(57) ABSTRACT

A layer of nanocrystals for use in making EEPROMs is made by creating a matrix of silicon seeds in annealed silicon oxide atop a thin silicon dioxide layer. Then nanocrystals are grown on the seeds by vapor deposition of silane in a reactor until a time before agglomeration occurs as silicon atoms crystallize on the silicon seeds to form a layer of non-contacting nanocrystals. A protective insulative layer is then deposited over the nanocrystal layer.

20 Claims, 4 Drawing Sheets

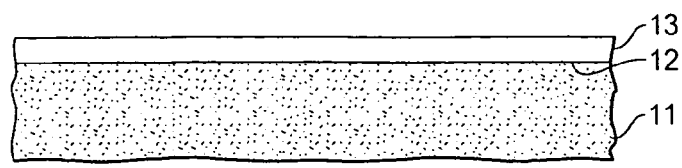
Fig._ 1
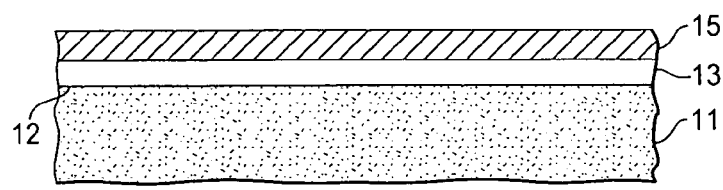
Fig._ 2
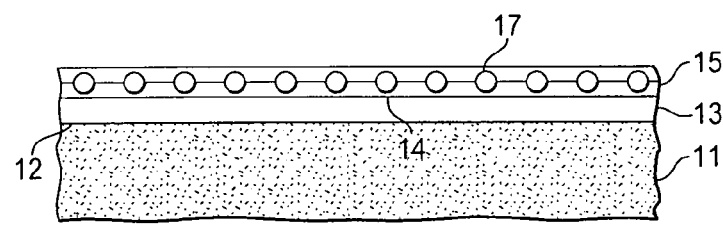
Fig._ 3
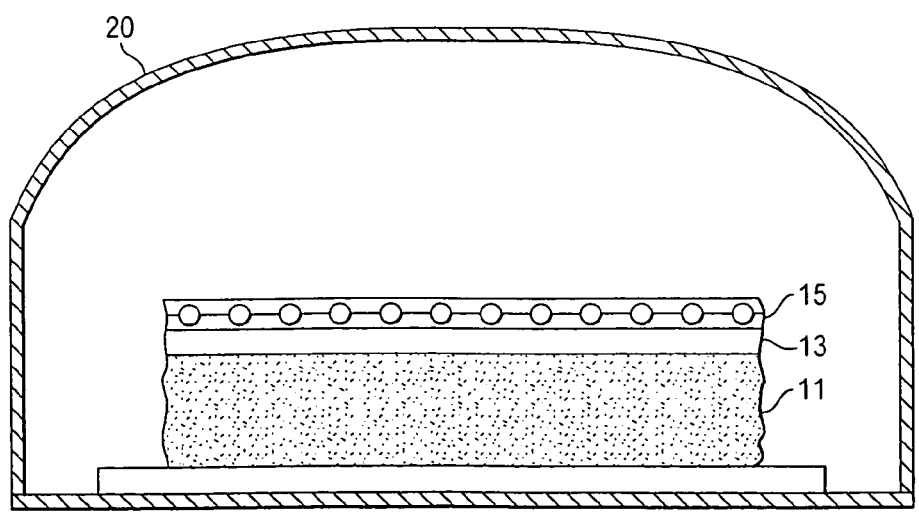
Fig._ 4

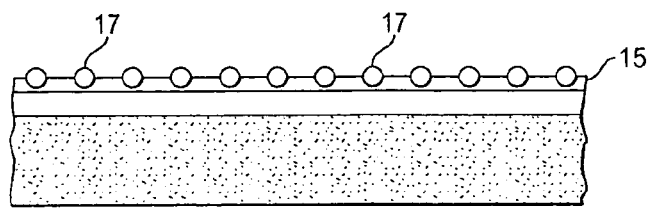
Fig._ 5
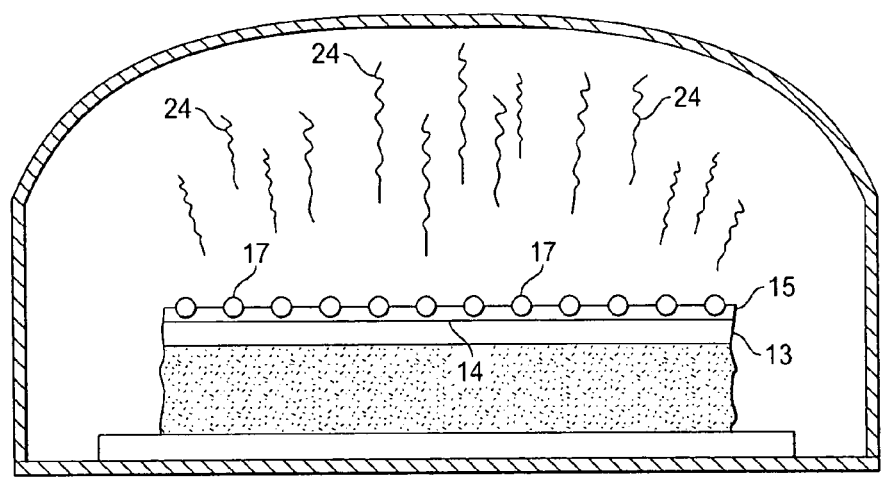
Fig._ 6
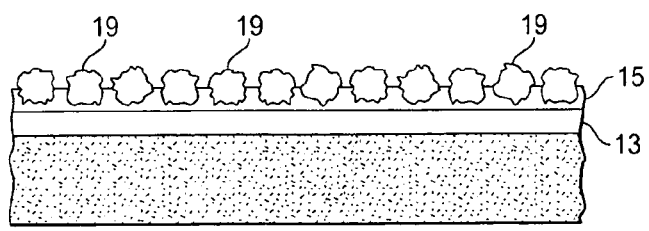
Fig._ 7
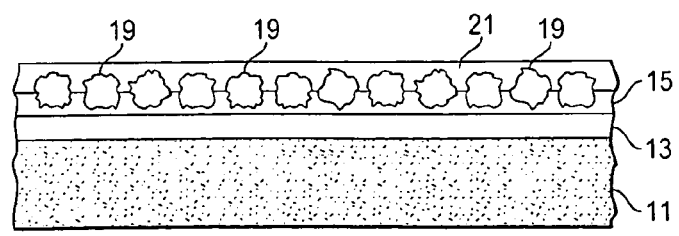
Fig._ 8

CHARGE TRAPPING NANOCRYSTAL DIELECTRIC FOR NON-VOLATILE MEMORY TRANSISTOR

TECHNICAL FIELD

The invention relates to transistor construction and, in particular, to manufacture of nanocrystal layers which may be used in non-volatile memory cells.

BACKGROUND ART

Non-volatile nanocrystal transistor memory cells are known. For example, U.S. Pat. No. 6,690,059 to B. Lojek describes a non-volatile memory transistor that uses a floating gate as a charge storage region, transferring charge through a tunneling barrier to nanocrystals. The device relies on a separate charge reservoir for charge supply, while the substrate is doped for conductivity between source and drain electrodes. By pulling charge from the charge reservoir to a separated nanocrystal layer, the electrostatic properties of the nanocrystal layer are modified, influencing a subsurface channel between source and drain in a MOS transistor. The nanocrystals are used to modify electrostatic properties of a separated region and then directly influence channel behavior in the usual way, characteristic of a MOS transistor. In the simplest mode of operation, a threshold may be established for charge transfer from the charge supply layer to the nanocrystal layer and this threshold is similar to the threshold of non-volatile memory transistors. However, further voltage changes will cause further electron transitions from the charge supply layer to the nanocrystal layer whereby the conductivity of the channel is changed in a stepwise manner, like modulation. Reverse voltages will cause depletion of the nanocrystal layer, driving electrons from the nanocrystal layer back to the charge supply layer. Conduction between source and drain amplifies the gate voltage in the amplifier mode or senses the pinch-off characteristic in the memory mode.

In U.S. Pat. No. 6,808,986 Rao et al describe a nanocrystal layer made using chemical vapor deposition. In U.S. Pat. No. 6,344,403 Madhukar et al describe a similar nanocrystal growth procedure.

An object of the invention is to provide a uniform, high density nanocrystal layer for more efficient discrete charge trapping in a memory transistor.

SUMMARY OF INVENTION

The above object has been achieved by growing silicon crystal nucleation sites, then exposing the sites in an etch. The exposed sites are then regrown by chemical vapor deposition to an enhanced size and protected with an oxide coating.

BRIEF DESCRIPTION OF THE DRAWINGS

FIGS. 1–8 are sequential side plan views of a method of making a nanocrystal charge storage layer in accordance with the present invention.

BEST MODE OF CARRYING OUT THE INVENTION

With reference to FIG. 1, a silicon substrate 11 is shown having a planar surface 12 which is polished and not patterned. Most commercial wafers already have adequate planarity from polishing and further polishing is not needed. Substrate 11, typically a silicon wafer, with doped regions has a desired conductivity for building transistors, preferably MOS or CMOS transistors.

On the surface 12 of the planar silicon substrate 11 an insulating silicon dioxide surface layer 13 is deposited by any of the usual methods as a first insulating layer. This oxide layer, typically a high quality thermal oxide layer, has a thickness in the range of 20 to 60 Angstroms. Such a thin oxide layer will serve as a tunnel oxide layer for a memory cell in which a conductive member resides above the oxide layer. In EEPROM memories, a typical floating gate is built above a thin oxide layer and for this purpose, the present invention contemplates a nanocrystal layer as the floating gate layer. Such nanocrystal layers are known in the prior art as charge storage layers, but they are made by different techniques.

In FIG. 2, a silicon oxide layer 15 is deposited on the silicon dioxide layer 13 as a second insulative layer. The silicon oxide layer may be virtually any insulative silicon oxide compound, $Si_xO_y$, (compound) where a smaller "x" than "y" is preferable for giving rise to small nucleation seed sites, although x=y will work. The silicon oxide compound may be applied by any known vapor deposition process, but the objective is to achieve a high density array of nucleation sites, with each site in an array having a surrounding plurality of nucleation sites, each less than approximately 100 Angstroms away from a neighboring site.

Figure 9:
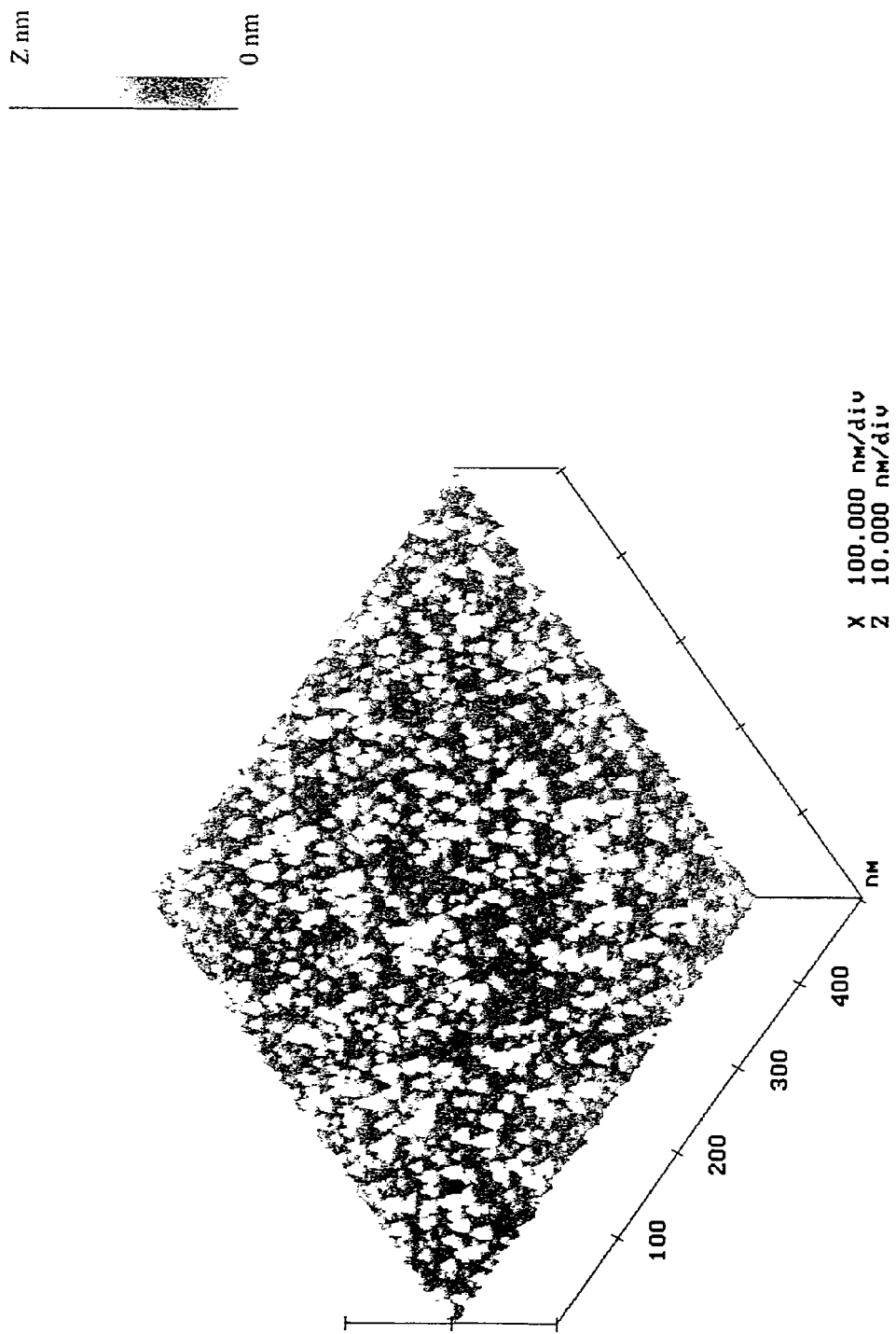
FIG. 9 is an atomic force microscope perspective view of a nanocrystal seed layer following FIGS. 1–4.

In FIG. 3, the silicon oxide layer 15 is seen to have a plurality of seeds or nuclei forming nucleation layer 17 near the boundary 14 between the silicon oxide layer 15 and the silicon dioxide layer 13. The seeds are molecular silicon introduced during formation of the silicon oxide, i.e. excess silicon molecules that aggregate and form tiny silicon crystals embedded in the insulative silicon oxide layer. The desired concentration of silicon nanocrystal seeds as obtained, as seen in FIGS. 4 and 9, by thermally annealing the silicon oxide layer 15 in an inert ambient gas 18, such as argon, in a thermal reactor or oven 20 at a temperature of between 800 to 1100 C for approximately 60 to 120 minutes. Alternatively, laser annealing could be used.

With reference to FIG. 5, the silicon oxide layer 15 is etched by means of a wet acid etch, at least partially exposing the silicon seed layer 17. Upon the tiny exposed seeds, nanocrystals are grown.

Figure 10:
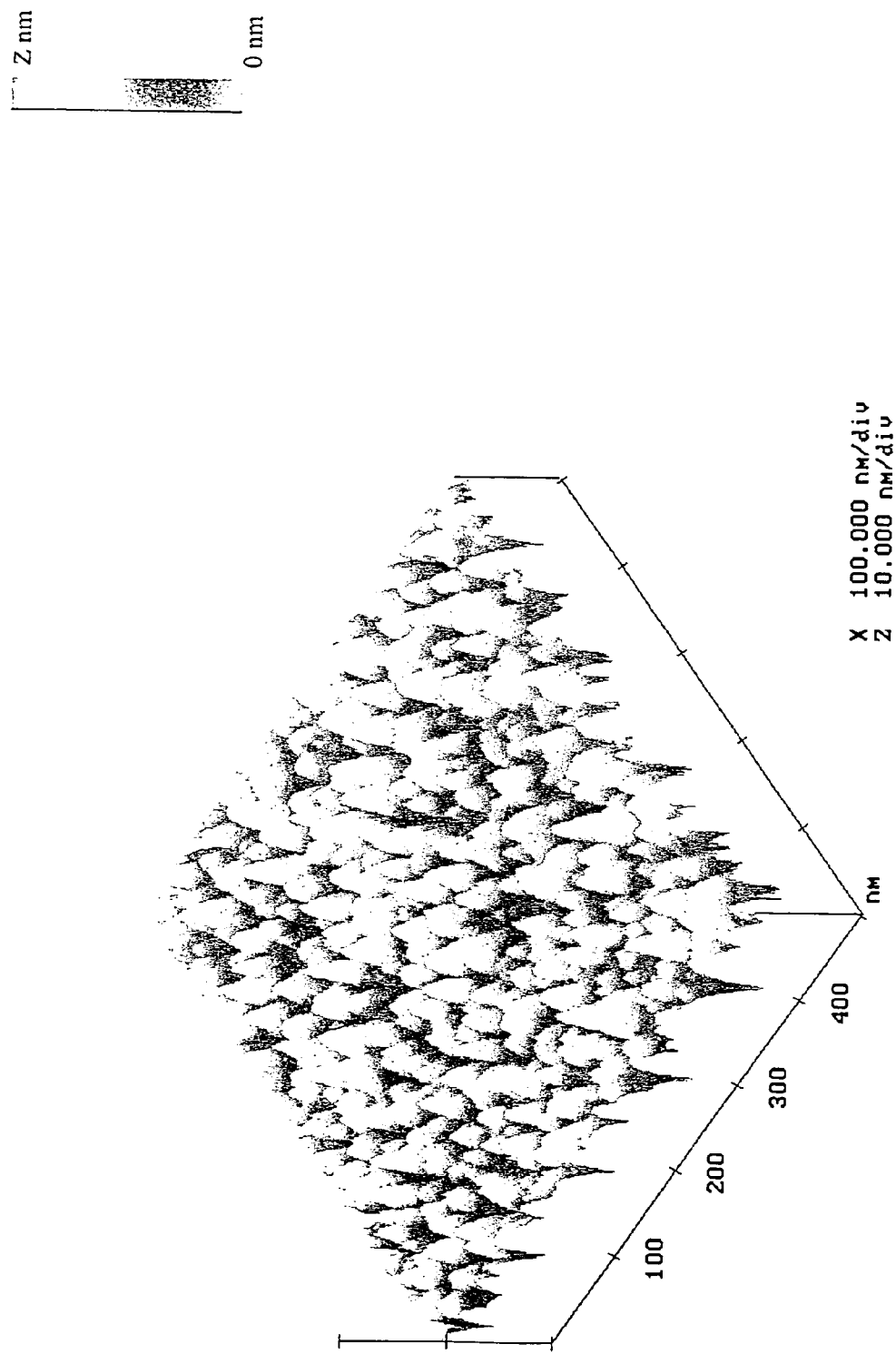
FIG. 10 is an atomic force microscope perspective view of a nanocrystal layer following FIGS. 1–8.

In FIG. 6, the nanocrystal layer 17 is seen to reside in proximity to the boundary layer 14 between the silicon oxide layer 15 and the oxide layer 13. The substrate is placed in a vapor deposition reactor 22 and silane 24 is introduced at a temperature and pressure wherein the silane will react upon contact with the silicon seed layer 17. The type of vapor deposition reactor is not critical and any type of reactor may be used, such as CVD, LPCVD, PECVD, EPI, etc. The silane or disilane is decomposed, allowing silicon atoms to be deposited on the seed layer forming silicon nanocrystals 19, seen in FIG. 7. In other words, the seed layer 17 in FIG. 6 is transformed into a nanocrystal layer 19 in FIG. 7. In other words, silicon crystals are grown upon the silicon seeds. While a typical size of a silicon seed is less than 10 Å, a typical size of a silicon nanocrystal is 40–60 Å. Vapor deposition continues until the nanocrystals grow to a size short of mutual contact. In other words, the silicon seeds of the seed layer are not allowed to grow into agglomerating members. On the other hand, the silicon nanocrystals of the present invention are larger than directly deposited silicon nanocrystals of the prior art. Growth can be controlled by observing the size of the agglomerating crystals and stopping vapor deposition short of agglomeration, as seen in FIG. 10.

With reference to FIG. 8, a protective insulative layer 21 is deposited over the grown nanocrystal layer 19 in a third insulative layer 15. The silicon substrate 11 may now be patterned into a memory array having EEPROMs with nanocrystal floating gates, i.e. non-volatile memory transistors.

The invention claimed is:

1. Method of making a nanocrystal charge storage layer comprising:
   embedding silicon seeds in a silicon containing insulative layer,
   etching the silicon containing insulative layer to expose the silicon seeds to an ambient environment, and
   vapor depositing silicon onto the silicon seeds thereby growing silicon nanocrystals.

2. The method of claim 1 wherein the silicon containing insulative layer is formed atop a layer of tunnel oxide.

3. The method of claim 2 wherein said tunnel oxide layer is atop a silicon wafer substrate.

4. The method of claim 1 further defined by depositing a protective layer over the silicon nanocrystals.

5. The method of claim 1 further defined by stopping growth of silicon nanocrystals prior to agglomeration.

6. The method of claim 1 wherein the silicon seeds are co-deposited with said silicon containing insulative layer.

7. Method of making a nanocrystal charge storage layer comprising:
   a) providing a planar silicon substrate portion,
   b) depositing an insulating silicon dioxide layer over the planar substrate having a thickness in the range of 20–60 Angstroms,
   c) depositing a silicon oxide compound layer over the insulating silicon dioxide layer having a thickness in the range of 20–50 Angstroms,
   d) annealing the silicon oxide layer in an inert atmosphere until silicon nucleation seeds form at the silicon dioxide compound—silicon oxide boundary,
   e) etching the silicon oxide layer to partially expose the silicon nucleation seeds,
   f) vapor depositing silicon onto the silicon nucleation seeds wherein a layer of non-agglomerating nanocrystals is formed,
   g) covering the layer of nanocrystals with a protective insulative layer.

8. The method of claim 7 wherein the silicon oxide layer has a composition of $Si_xO_y$, where x is smaller than y.

9. The method of claim 7 wherein the silicon oxide layer has a composition of $Si_xO_y$, where x is equal to y.

10. The method of claim 7 wherein said annealing is by thermal annealing.

11. The method of claim 7 wherein said annealing is by laser annealing.

12. The method of claim 7 further defined by vapor depositing said silicon by introducing silane into a reactor.

13. The method of claim 7 further defined by patterning the nanocrystal charge storage layer and forming non-volatile memory transistors.

14. Method of making a nanocrystal charge storage layer comprising:
   providing a doped bulk planar surface, with doping of the bulk to a degree adequate for building CMOS transistors,
   depositing a silicon dioxide layer on said planar surface having a thickness less than 50 Angstroms as a first insulative layer,
   depositing a second insulative layer atop the silicon dioxide layer,
   depositing silicon seeds within said second insulative layer,
   etching the second insulative layer to partially expose the silicon seeds,
   growing silicon nanocrystals from the silicon seeds, and
   covering the silicon nanocrystals with a third insulative layer.

15. The method of claim 14 wherein the doped bulk is a doped silicon wafer.

16. The method of claim 14 wherein said insulative layer is silicon oxide having the formula $Si_xO_y$, where x and y are integers.

17. The method of claim 16 wherein y is greater than x.

18. The method of claim 16 wherein y is equal to x.

19. The method of claim 14 further defined by patterning the nanocrystal charge storage layer and forming non-volatile memory transistors.

20. The method of claim 14 further defined by co-depositing said silicon seeds and said second insulative layer.

* * * * *